(12) United States Patent
Knight et al.

(10) Patent No.: US 6,278,515 B1
(45) Date of Patent: Aug. 21, 2001

(54) METHOD AND APPARATUS FOR ADJUSTING A TILT OF A LITHOGRAPHY TOOL

(75) Inventors: Stephen E. Knight, Essex Junction; Charles A. Whiting, Milton, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/650,423

(22) Filed: Aug. 29, 2000

(51) Int. Cl.[7] .................. G03B 27/52; G03B 27/42; G03B 27/32; G03F 9/00; H01J 3/14
(52) U.S. Cl. .................. 355/55; 355/53; 355/77; 430/4; 430/30; 430/311; 430/314; 250/216; 250/492.2; 250/492.22
(58) Field of Search .................. 355/53, 55, 77; 430/4, 30, 311, 314; 250/216, 492.2, 492.22

(56) References Cited

U.S. PATENT DOCUMENTS

| | | |
|---|---|---|
| H1774 | 1/1999 | Miyachi . |
| Re. 33,836 * | 3/1992 | Resor, III .................. 355/43 |
| 4,413,909 | 11/1983 | Pohle . |
| 4,504,144 | 3/1985 | Trost . |
| 4,516,852 | 5/1985 | Liu et al. . |
| 5,300,786 * | 4/1994 | Brunner et al. .................. 250/548 |
| 5,362,585 * | 11/1994 | Adams .................. 430/30 |
| 5,398,112 | 3/1995 | Ai et al. . |
| 5,461,237 | 10/1995 | Wakamoto et al. . |
| 5,737,063 | 4/1998 | Miyachi . |
| 5,745,309 | 4/1998 | Salmon . |
| 5,812,407 | 9/1998 | Sato et al. . |
| 5,825,043 | 10/1998 | Suwa . |
| 5,864,433 | 1/1999 | Takahashi et al. . |
| 5,894,132 | 4/1999 | Nakasuji et al. . |
| 5,898,479 | 4/1999 | Hubbard et al. . |
| 5,929,978 | 7/1999 | Masaki . |

* cited by examiner

Primary Examiner—Russell Adams
Assistant Examiner—Khaled Brown
(74) Attorney, Agent, or Firm—Connolly Bove Lodge & Hutz; William D. Sabo

(57) ABSTRACT

A method and apparatus according to the present invention achieves improved lithographic printing of semiconductor wafers. An optimum tilt for projection optics in a lithography tool relative to a wafer in a direction perpendicular to a scanning direction is characterized for each of a plurality of wafer technologies and levels. The corresponding optimum tilt is retrieved from a database to adjust the lithography tool accordingly, depending upon what technology and level is being processed.

18 Claims, 10 Drawing Sheets

METHOD AND APPARATUS FOR ADJUSTING A TILT OF A LITHOGRAPHY TOOL

BACKGROUND OF THE INVENTION

The present invention relates to a method and apparatus for improving the printing of design images on semiconductor wafers. More particularly, it relates to determining a tilt of projection optics relative to a wafer surface for a given technology, level and lithography tool. The tilt determined compensates for non-idealities in the optics to improve image quality.

A semiconductor chip typically comprises a plurality of design levels. Each level is added successively on top of other levels to obtain a target wafer. To add a given level to a wafer comprising existing levels, the wafer is coated with a uniform film of photoresist. In a lithography or "printing" step, a mask containing an image of the design at the level to be added is interposed between the wafer and an illumination source. Ultraviolet radiation of varying wavelengths is projected from the illumination source, through the mask, and onto the photoresist on the wafer surface.

The mask defines areas where the radiation is blocked, and areas where it is allowed to pass through and form an exposure field on the photoresist. In areas where the photoresist is exposed, the solubility properties of the photoresist are changed. Effectively, the image of the design contained in the mask is transferred to the photoresist. The photoresist may subsequently be etched away to effect a physical transfer of the design into the wafer. Ions may be implanted as desired in the design to change electrical characteristics of the wafer material.

In one approach to lithographic printing, only a portion of the mask is illuminated, and the mask and the wafer are "scanned", or moved past the illumination source to transfer the mask design onto the wafer. An exposure slit interposed between the illumination source and the mask defines the portion to be illuminated and an exposure field on the wafer surface.

One parameter which is controlled on lithography systems is the tilt of the projection optics relative to the wafer. In known lithography tools such as Micrascans, for example, a tilt that controlled is "Theta-X" ($\theta_X$), which is the tilt of the optics wave front projected by the lithography tool relative to the wafer in a direction perpendicular to a scanning direction.

Existing lithography systems typically perform control of $\theta_X$ by imaging a specific test structure, for example, a resist stud, at various focus settings along the exposure slit direction. The tilt is adjusted until the nominal focus for the test structure is nominally identical across the exposure slit. It is assumed in these existing systems that there is a unique $\theta_X$ tilt which is applicable to all image types, and that using the $\theta_X$ obtained from imaging the test structure will adequately represent the behavior of other image types.

However, in conceiving the present invention, it has been recognized that a $\theta_X$ tilt which is adjusted for such factors as image type, wafer level and technology, and lithography tool can produce better image fidelity. The adjustment of the $\theta_X$ tilt compensates for factors which otherwise would interact with the $\theta_X$ tilt to cause an imperfect transfer of the design image in the mask to the wafer.

For example, typically a mask image is several times greater than the actual physical design size and is sent through reduction lensing in the projection optics to reduce it to the necessary size for projection onto the wafer. Non-idealities in the reduction lensing and other elements in the projection optics can cause undesired variations between the mask image and the image transferred onto the photoresist across an exposure field. For example, design image features that should be identical everywhere within the exposure field may be different in shape and size depending on their location within the exposure field. Such variations can detract from performance in the final fabricated chip. Diffraction effects, when image sizes approach the wavelength of the illumination radiation, can also produce non-uniformities in printing. Outright imaging failure can also occur in the exposure field, necessitating either reworking the wafer or scrapping it.

In view of the above, a method and apparatus for improving lithographic printing by adjusting the $\theta_X$ tilt according to parameters including wafer level and technology are disclosed hereinafter.

SUMMARY OF THE INVENTION

In a method and apparatus according to the present invention, a tilt of projection optics of a lithography tool relative to a wafer being printed is adjusted according to wafer technology and level to compensate for non-idealities in reduction lensing and other factors affecting image quality.

In an embodiment, the tilt of the projection optics relative to an axis which is substantially perpendicular to a scanning direction for the wafer is determined in accordance with criteria for obtaining a target image quality. The tilt which obtains the target image quality is characterized for each of a plurality of wafer technologies and levels, and stored in a data base.

Subsequently, during a printing phase of semiconductor chip production, a logistics system passes parameters including the level and technology of the wafer to a software retrieval system which retrieves the corresponding tilt parameter from the data base in which it was stored. Printing of the wafer is then performed using this tilt which achieves a target image quality.

DETAILED DESCRIPTION OF THE INVENTION

Figure 1:
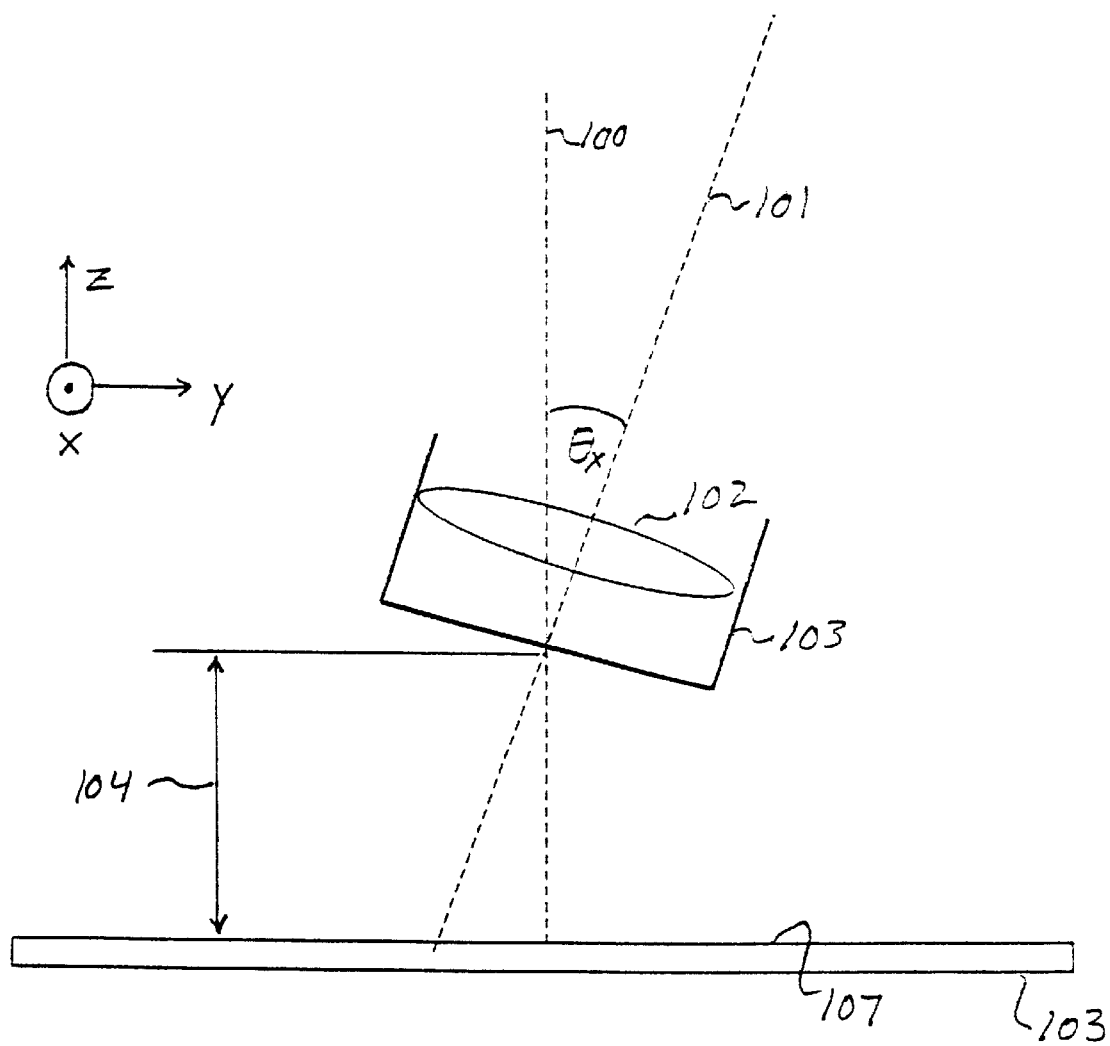
FIG. 1 shows $\theta_X$ for projection optics of a lithography tool relative to a wafer.

FIG. 1 shows a projection optics assembly 103 of a lithography tool positioned above a surface 107 of a wafer 103. The projection optics assembly has a tilt angle, $\theta_X$, defined by a virtual optics exposure axis 101 offset from an axis 100 substantially perpendicular to the wafer surface 107. The projection optics assembly has an average focus z distance 104 from the wafer surface 107. An optics wavefront is projected through reduction lensing 102 to impinge on the surface 107, creating an exposure field.

The value of $\theta_X$ defines an angle of an exposure slit in the projection optics relative to the wafer surface. In existing lithography systems, a single value for $\theta_X$ is typically used for all image types being printed and across different wafer production lots. However, because of non-idealities or aberrations in the projection optics, a given value for $\theta_X$ can result in at least image size variation across an exposure field, which is a potential performance detractor in the final product, or result in outright imaging failure in portions of the exposure field.

Other factors which affect a lithographic result depending upon the value of $\theta_X$ include the image type. For example, a first value for $\theta_X$ will produce better image fidelity for an image including a number of parallel lines and spaces than a second value for $\theta_X$ different from the first value. The second value for $\theta_X$, on the other hand, might produce better image fidelity for images comprising isolated elements such as contact holes than the first value. Similarly, a given $\theta_X$ value will produce a different image quality than another $\theta_X$ value when an image pattern is sparse as opposed to dense, or if image sizes vary substantially. For example, when image sizes approach the wavelength of the exposure radiation, diffraction effects are a factor in image quality.

In semiconductor chip production, the lithography step is part of a largely automated process. Semiconductor wafers are processed in lots. In a processing step prior to the lithography step, a lot of wafers is coated with a photoresist layer as described above. The lot then proceeds automatically to a lithography tool where images corresponding to a specific wafer level are printed.

The semiconductor wafer lots are characterized by a plurality of different technologies and levels. The term "technology" as used herein describes, but is not limited to, a set of groundrules, i.e, a minimum design or printed feature size, as well as a set of common processing steps. When "technology" is used in conjunction with the term "level", a set of possible image types present for a given lithographic exposure are also described, since a designation of a particular level in this context denotes a physical, electrical function. For example, specifying a first technology and a contact level might identify the image types on that level as square and rectangles, while specifying a second technology and contact level different from the first would identify the image types present on that level as only squares.

According to the present invention, a $\theta_X$ value which obtains a target image quality in terms of a lithographic result is determined or characterized for each technology, level and lithography tool in a semiconductor chip production system. The $\theta_X$ values corresponding to each of the levels, technologies and lithography tools are stored in a data base used by the production system. A logistics system which controls the processing sequence of a lot of wafers interacts with the lithographic equipment. The logistics system contains information relating to the current level and technology of a lot being processed, and retrieves the $\theta_X$ information for that level and technology from the data base. The retrieved information is used to adjust the tilt of a lithography tool accordingly. The lot of wafers is printed with the retrieved $\theta_X$ value for improved image quality.

In an embodiment, monitoring of the image quality produced by the lithographic step using the assigned $\theta_X$ values is performed, and if drift in the lithography tool is detected, corrections are applied to adjust $\theta_X$ dynamically. Further, pre-determined limits are set defining a permissible range of corrections to $\theta_X$ applied by the foregoing monitoring and correction step. If the corrections exceed a predefined limit, the system is shut down so that maintenance can be performed.

Figure 2:
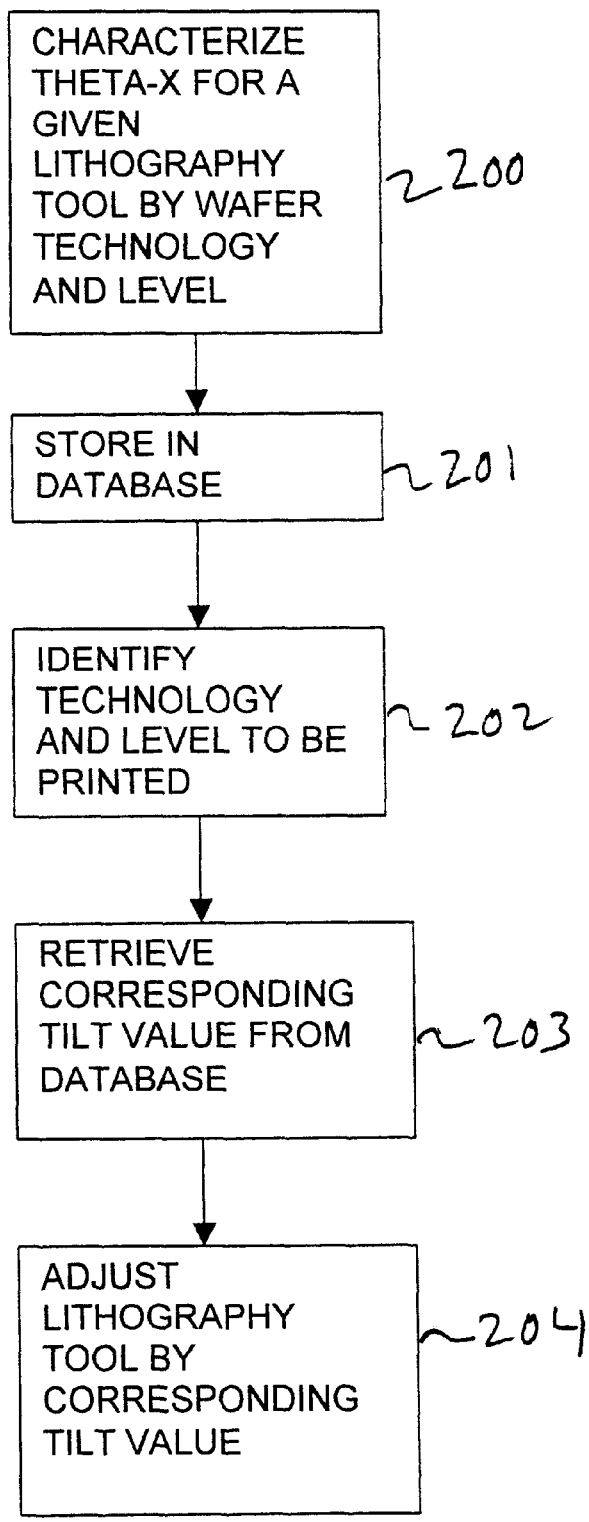
FIG. 2 shows a functional block diagram illustrating a process flow for adjusting $\theta_X$ according to the invention.
Figure 3:
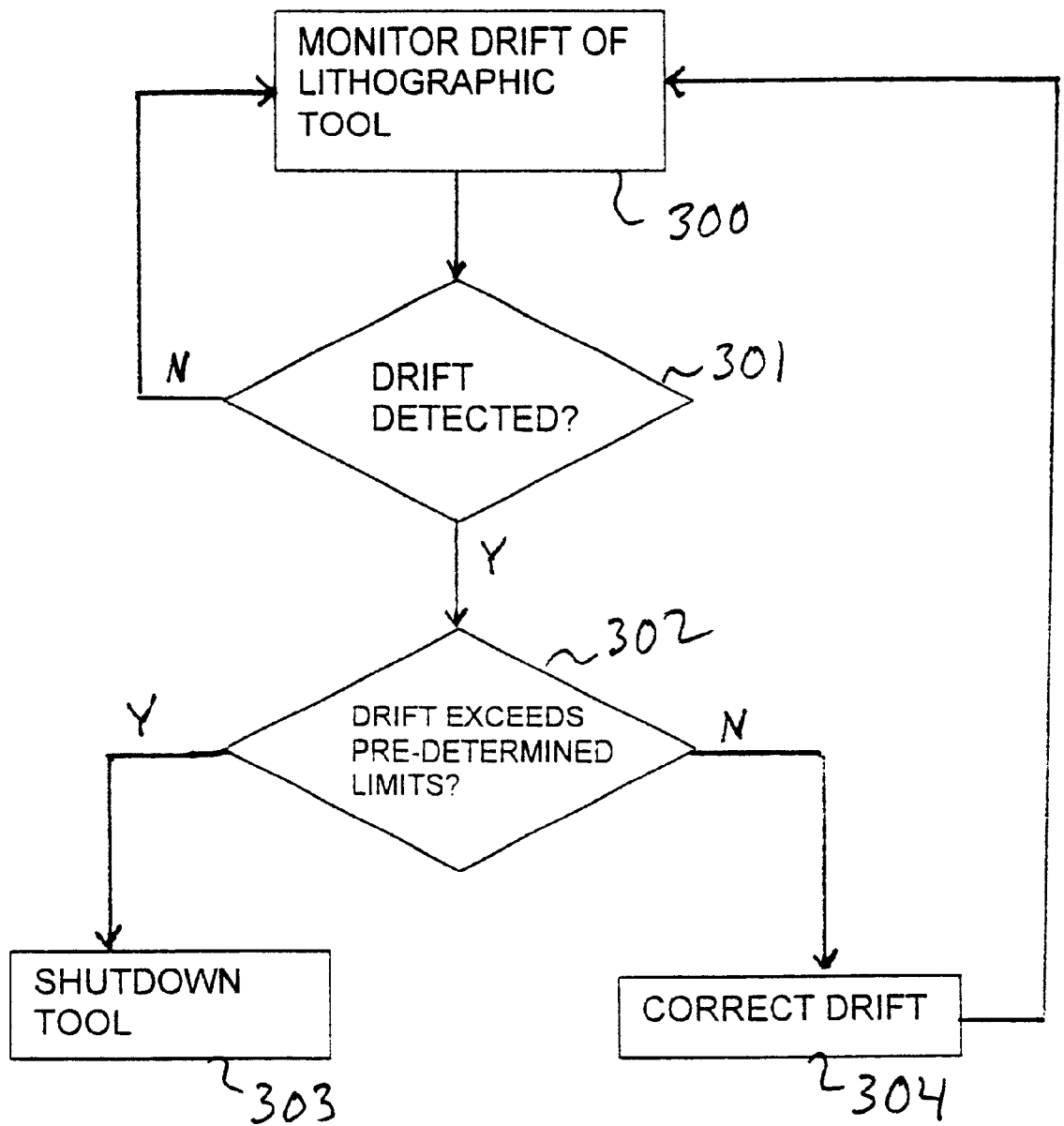
FIG. 3 shows a functional block diagram illustrating a process flow for monitoring and correcting drift in a lithography tool.

FIGS. 2 and 3 illustrate the foregoing. As shown in blocks 200 and 201 of FIG. 2, $\theta_X$ tilt values are characterized by wafer technology and level for a given lithography tool to meet target image quality criteria, and the tilt values are stored in a database. During a lithographic printing phase of a semiconductor chip production process, a logistics system identifies the current technology and level of a wafer to be printed as shown in block 202. Then, as shown in block 203, the tilt value corresponding to the technology and level, and lithography tool being used for printing, are retrieved from the database, using retrieval means included in the production system. The lithography tool is adjusted by the corresponding tilt value to execute printing meeting the target image quality criteria, as shown in block 204.

As shown in block 300 of FIG. 3, the lithography tool may be monitored for drift, indicated by a variation in image quality produced. The variation may be determined, for example, in terms of a differential in image size for images that should be identical.

If drift is detected, it is then determined whether the drift exceeds pre-determined limits, as shown in blocks 301 and 302. Exceeding such pre-determined limits could indicate a need for maintenance of the lithography tool. Accordingly, if the limits are exceeded, the tool is shut down for maintenance as shown in block 303. If not, the $\theta_X$ tilt for the tool is corrected dynamically as shown in block 304.

Figure 4:
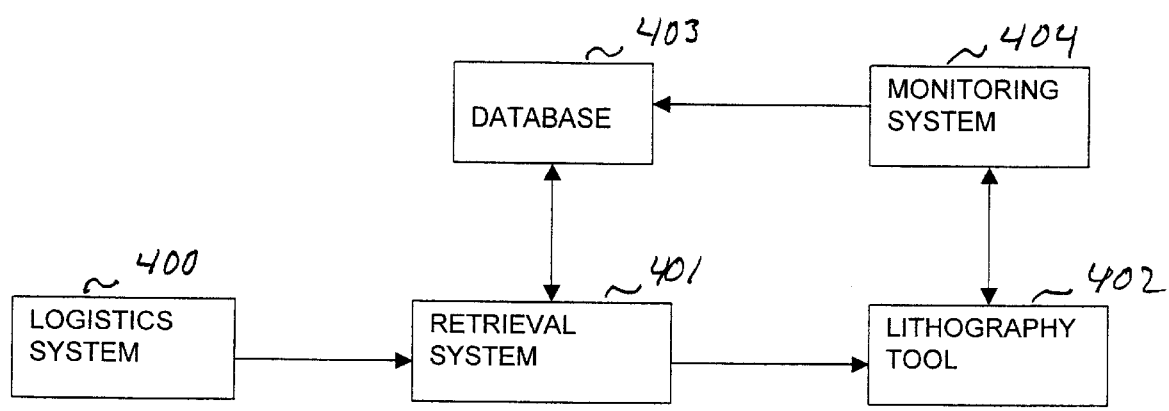
FIG. 4 shows components of a lithographic printing portion of a semiconductor chip production system.

FIG. 4 shows components of a semiconductor chip production system for implementing the invention. A logistics system 400 controls movement of wafer lots through stages in the production system. The logistics system handles parameters needed for the printing stage, including parameters relating to the technology and level of a wafer being printed. Other parameters handled by the logistics system include the lithography tool being used, the exposure dosages of illumination to be applied, and the average focus z distance 104.

The logistics system passes the parameters needed for printing to a retrieval system 401 which comprises software for retrieving the $\theta_X$ tilt values corresponding to the parameters supplied by the logistics system from database 403. The retrieval system then passes the corresponding tilt values to a lithography tool 402, which is adjusted accordingly. A monitoring system 404 monitors and corrects drift in the lithography tool and may record the performance of the tool in the database 403. The monitoring system may shut down the lithography tool if drift exceeds pre-determined limits.

The following describes a procedure for characterizing or determining a value of $\theta_X$ for a given lithography tool per wafer technology and level, to obtain a target image quality in lithography. The criteria for image quality include that for recurring image types, the image size is substantially identical across a full exposure field of a scan.

Figure 5:
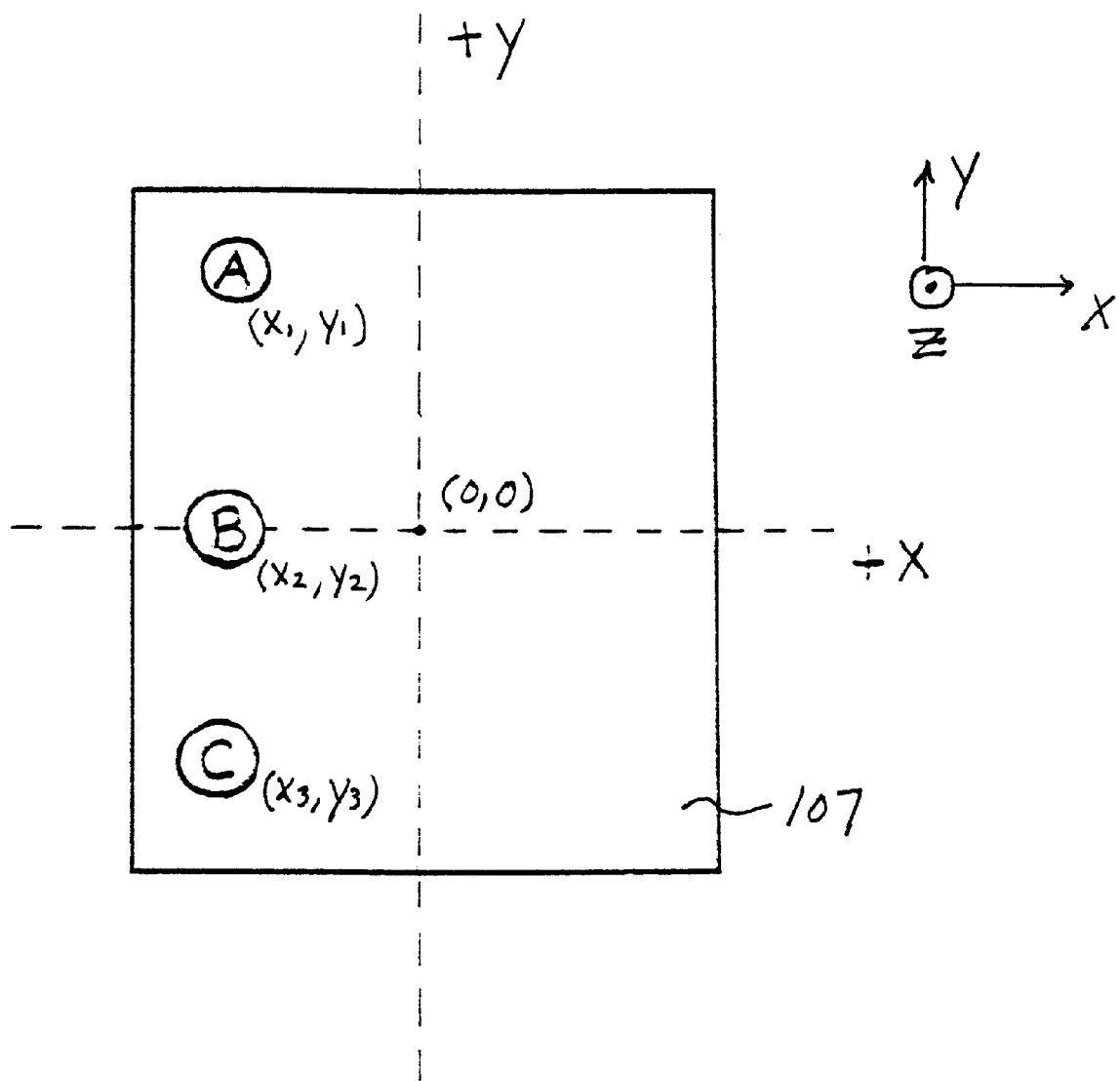
FIG. 5 shows coordinate axes of a lithography tool projected onto the surface of a wafer including images at sites A, B and C.

FIG. 5 shows an example of a coordinate system comprising orthogonal x, y and z axes such as would be used by projection optics in a lithography tool, such as projection optics assembly 103 of FIG. 1, to orient itself with respect to a surface 107 of a semiconductor wafer for performing a scan across the wafer surface to print an image. The projection optics 103 as shown in FIG. 1 are to be understood to be positioned at a focus z offset 104 from the surface 107, the focus z offset being in a direction along the positive z axis substantially perpendicular to the surface 107.

The circled characters A, B, C of FIG. 5 represent images of a recurring type at sites A, B and C respectively in an exposure field. The recurring images are characteristic of a given wafer technology and level. Site A is located at coordinate $(x_1, y_1)$, site B is located at coordinate $(x_2, y_2)$, and C is located at coordinate $(x_3, y_3)$. The x coordinate is fixed; i.e., $x_1=x_2=x_3$. The positions of sites A, B and C correspond to an upper part, center, and lower part, respectively, of an exposure slit in the projection optics assembly 103.

Figure 6:
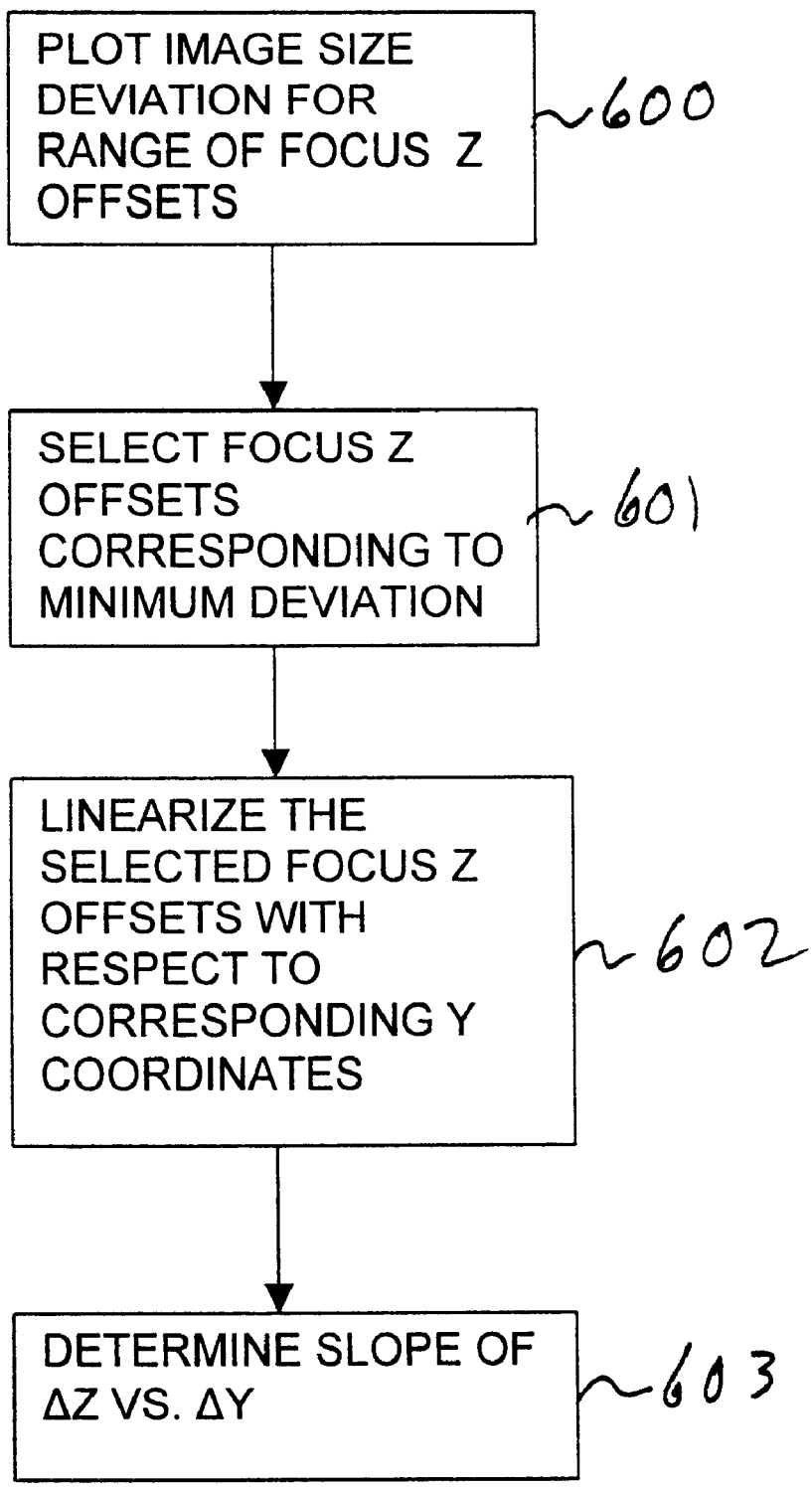
FIG. 6 shows a functional block diagram illustrating a process flow for characterizing an optimum $\theta_X$ according to the invention.

Referring now to FIG. 6, the recurring images at each of sites A, B and C are scanned through the exposure slit into the wafer surface along a direction substantially parallel to the y axis for a range of focus z offset values. As shown in block 600, the resulting images are then compared to a reference image to obtain a plot of image size deviation as a function of the focus z offset. Such a plot may be referred to as a focus/expose or Bossung plot.

Figure 7:
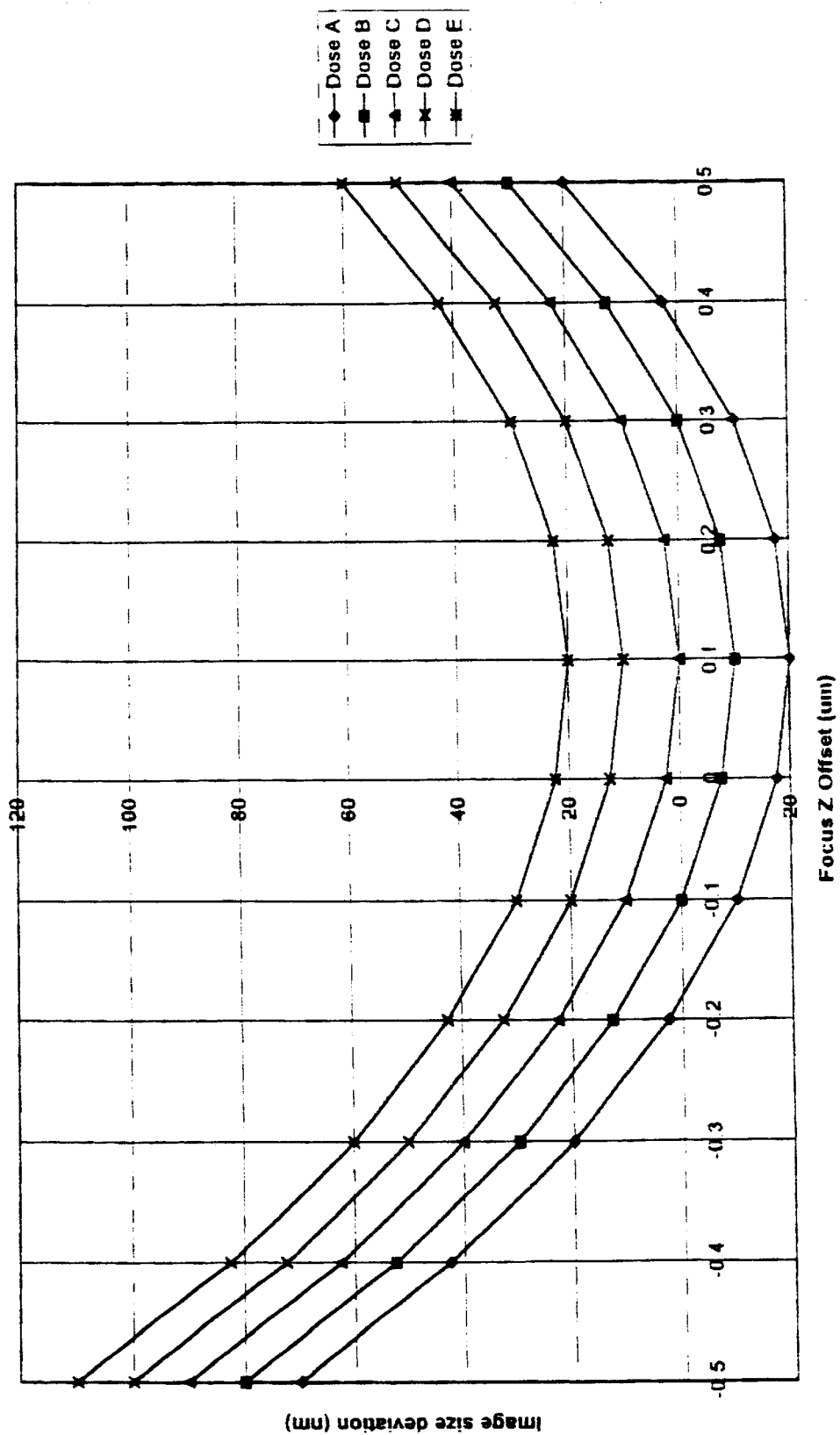
FIG. 7 shows a focus/expose plot which maps image size deviation against a focus offset from a wafer surface in the z direction for images at site A of FIG. 5.

As shown in block 601, a focus z offset corresponding to a minimum image size deviation is selected for each plot. FIG. 7 shows image size deviation versus focus z offset for a series of exposure doses A–E of scanning radiation for site A. As can be seen in FIG. 7, the image size deviation has a minimum value at a focus z offset of approximately 0.1 $\mu$m. In the example shown in FIG. 7, $y_1$ had a value of +13,000 $\mu$m.

Figure 8:
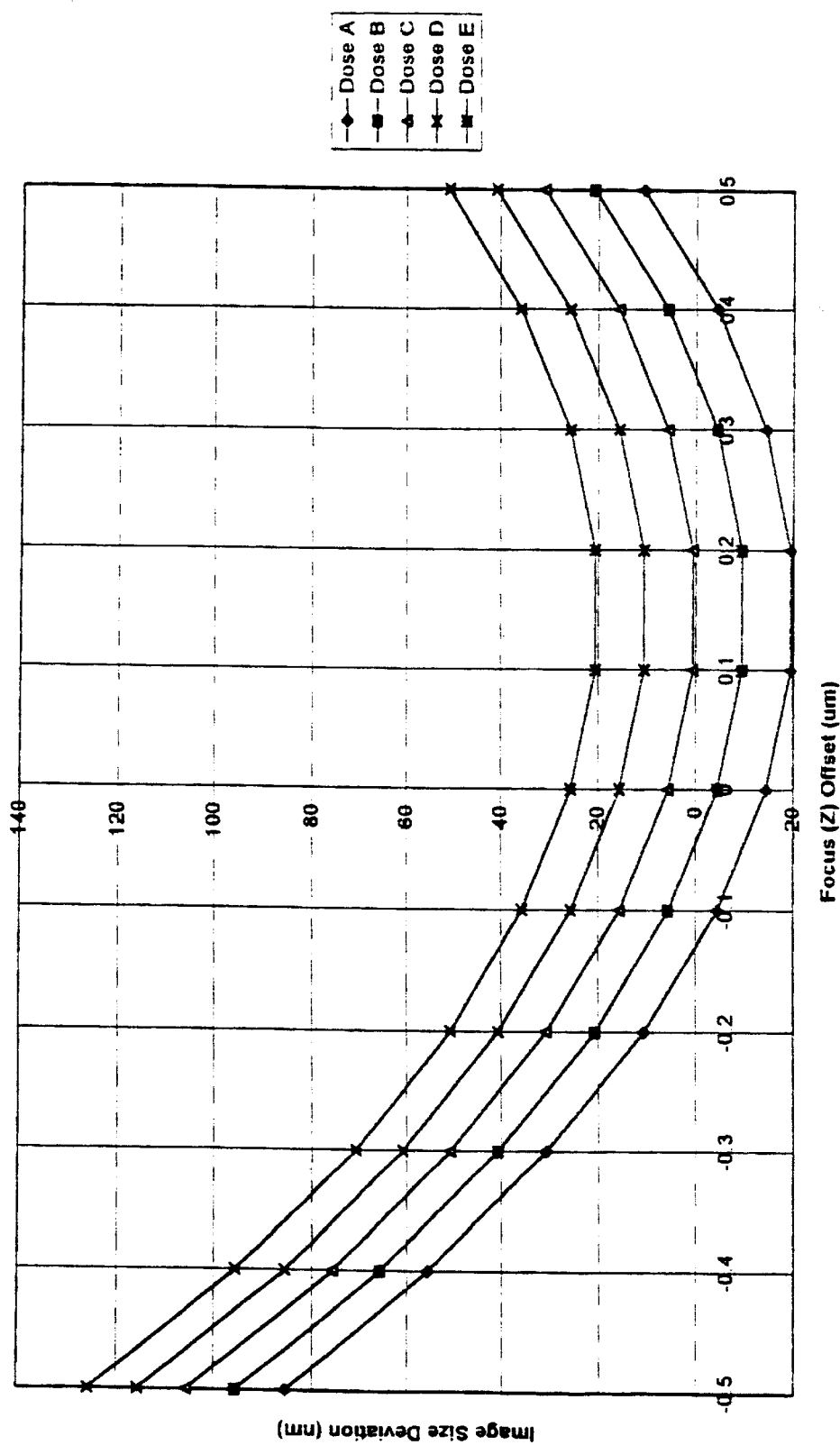
FIG. 8 shows image size deviation versus focus z offset for images at site B of FIG. 5.

FIG. 8 shows the above described process as applied to site B. As seen in FIG. 8, a minimum deviation occurs at a focus z offset of approximately 0.15 $\mu$m. The $y_2$ coordinate had a value of 0 $\mu$m.

Figure 9:
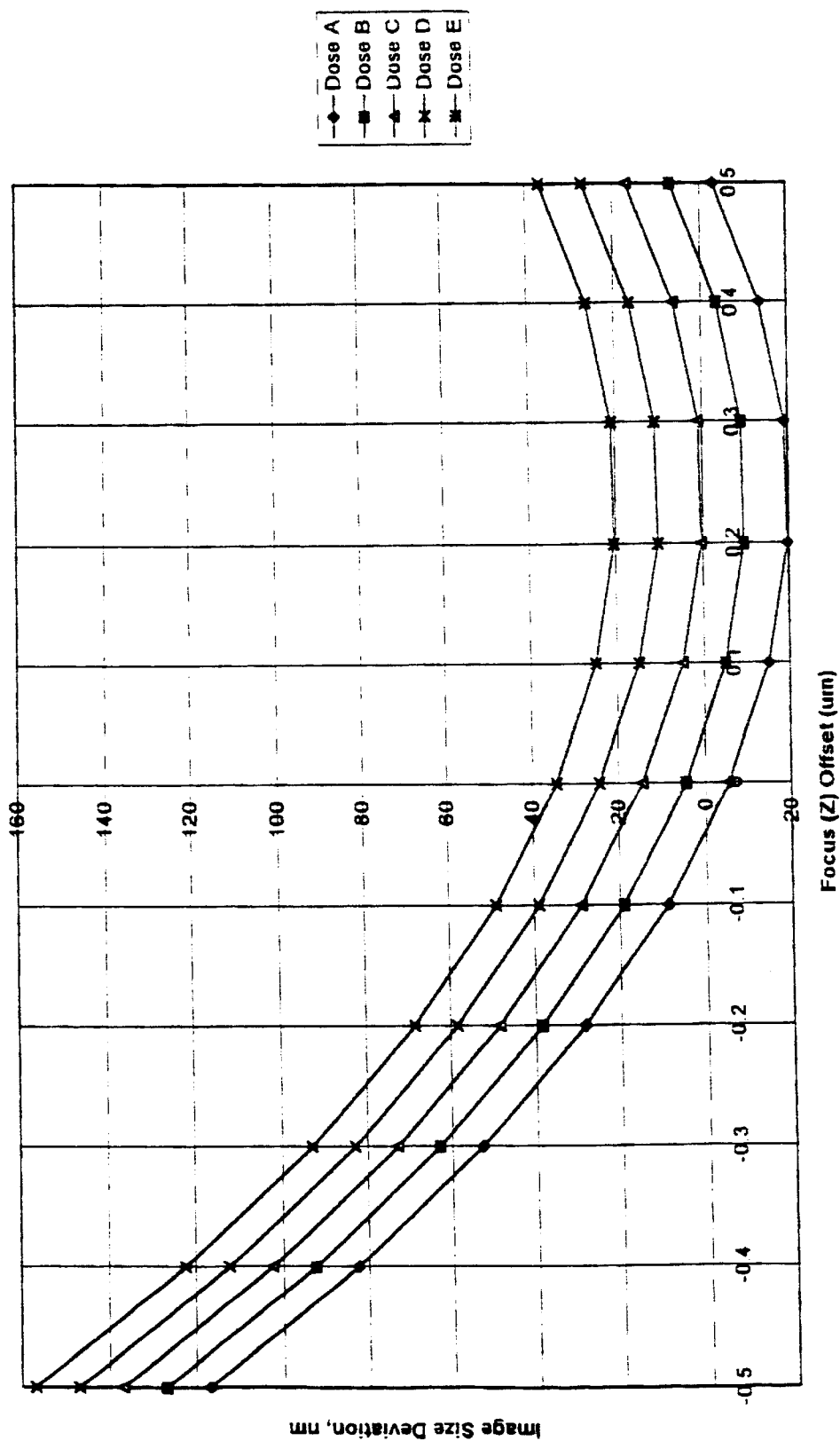
FIG. 9 shows image size deviation versus focus z offset for images at site C of FIG. 5.

FIG. 9 shows the image size deviation versus focus z offset for site C. A minimum deviation occurs at a focus z offset of approximately 0.24 $\mu$m. The $y_3$ coordinate had a value of −13,000 $\mu$m.

Figure 10A:
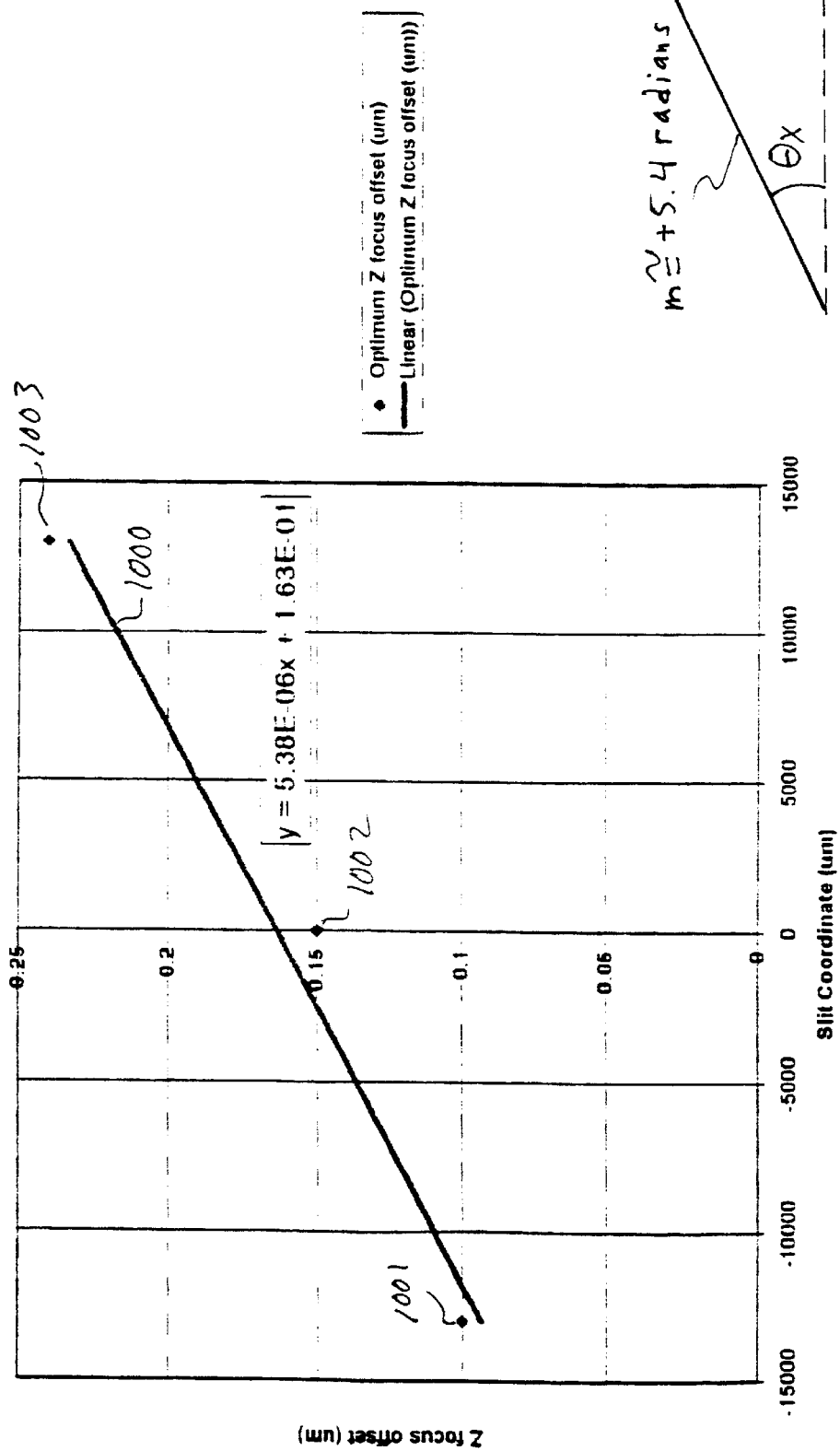
FIG. 10A shows a line fitted to a set of points representing an optimum z focus offset for sites A, B and C above.

Returning to FIG. 6, the selected focus z offsets are then linearized and a slope is derived therefrom, as shown in blocks 602 and 603. The selected focus z offsets establish a pattern as shown in FIG. 10A. Referring now to FIG. 10A, a line 1000 is derived from the pattern of focus z offset points yielding the minimum image size deviation obtained for each of sites A, B and C as described above. In FIG. 10A, point 1001 corresponds to the optimum focus z offset found for site C, point 1002 corresponds to the optimum focus z offset for site B, and point 1003 corresponds to the optimum focus z found for site A.

Figure 10B:
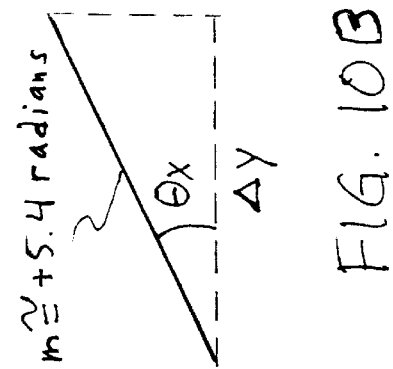
FIG. 10B shows a relationship between $\theta_X$ and the orthogonal axes of a coordinate system used by a lithography tool.

FIG. 10B shows $\theta_X$ in terms of a relationship between a change in the focus z offset ($\Delta z$) and a change in the y coordinate ($\Delta y$). In FIG. 10B, the tangent of $\theta_{X'}=\Delta z/\Delta y=$the slope of the line 1000 derived as described above. Because $\Delta z \ll \Delta y$, $\Delta z/\Delta y \cong 0$, so by the small-angle formula, tangent $\theta_{X'} \cong \theta_{X'}$. Therefore, $\theta_{X'} \cong$ the slope of line 1000. In the example, $\theta_X$ is $\cong 5.4$ microradians.

As described above, a procedure such as the foregoing would be performed to characterize a $\theta_X$ tilt value yielding an image quality in accordance with defined criteria, for each lithography tool, wafer technology and level in a semiconductor chip production system. The tilt values would be stored and then retrieved as needed for the corresponding lithography tool, technology and level for improved quality in printing.

Additional or alternative methods could be used to characterize a $\theta_X$ tilt value yielding an image quality in accordance with defined criteria, for each lithography tool, wafer technology and level. For example, characterization of an optimal $\theta_X$ (optimal in that defined image quality criteria are met) could be performed relative to a qualitative parameter of image fidelity such as resist image profile. Resist image profile refers to a cross-sectional profile of wafer structures which may be evaluated qualitatively. Using such a cross-sectional profile, a person skilled in lithography would appraise image quality, and an optimum focus z value would be determined for different y-axis coordinates within an exposure field based upon a perceived image quality. A set of optimum focus z values could then linearized and a $\theta_X$ value corresponding thereto could be derived as described above.

Another alternative would be to characterize an optimal $\theta_X$ relative to a common process window. A common process window refers to a set of processing parameters including exposure dose and focus z that achieve a target image quality and size for an image type. A common process window can also be developed for images of different types. The $\theta_X$ parameter can be included in the set of processing parameters used to determine a common process window, and varied to characterize an optimum $\theta_X$ per wafer technology and level.

Another method for characterizing an optimal $\theta_X$ would be to obtain focus z versus exposure dosage matrices for multiple image types at different $\theta_X$ values, and then characterize a common focus z/exposure dosage process latitude for the multiple image types. A process latitude is a measure of how much a parameter used in lithography can vary while maintaining acceptable image quality. For example, a process latitude in the focus z parameter with respect to a fixed exposure dose could be measured by determining a range within which focus z can be varied before image quality and size degradation occurs to the extent that the images fail. Another process latitude measure could be determined by fixing focus z and varying the exposure dosage. A measure of process latitude can also be determined with respect to processing steps other than the lithography step.

According to the invention, a common focus z/exposure dose latitude process latitude would be characterized for multiple image types and different $\theta_X$ values as described above. A maximum process latitude with respect to $\theta_X$ would then be determined by plotting the foregoing common focus z/exposure dose latitude versus the range of $\theta_X$ values, thereby characterizing an optimum $\theta_X$ in terms of process latitude. One measure of the process latitude might be the integrated area under an exposure/dose curve.

Another method of characterizing an optimum $\theta_X$ would be to optimize $\theta_X$ relative to across-field linewidth variation (AFLV). AFLV is a known parameter in the lithographic art and refers to linewidth variation across a chip for both nested and isolated structures, and horizontal and vertical features. AFLV is an important parameter at the gate level since linewidth variation at the gate level affects a processing speed of the chip.

To characterize an optimum $\theta_X$ in terms of AFLV, several chips would be printed using different $\theta_X$ values. Multiple image types per chip would be measured and the difference between the largest and smallest features would be recorded as the AFLV. $\theta_X$ would then be chosen to minimize the AFLV.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method comprising:
   determining a tilt value for projection optics of a lithography tool relative to a semiconductor wafer by technology and level, in terms of criteria defining an image quality of an image printed on said level; and
   adjusting said projection optics by the tilt value corresponding to the technology and level being printed during a production of said wafer.

2. The method of claim 1, further comprising:
   providing semiconductor wafers to be printed in lots, said wafers comprising a plurality of levels and being of a plurality of different technologies;
   identifying a level and technology of a lot to be printed; and
   supplying said level and technology to said adjusting step.

3. The method of claim 1, wherein said criteria relate to a minimum deviation in image size.

4. The method of claim 1, further comprising:
   monitoring said lithography tool for drift in a tilt defined by said tilt value;
   correcting said tilt when drift is detected; and
   shutting down said lithography tool when said drift exceeds a pre-determined limit.

5. A method comprising:
   characterizing tilt adjustment values for a lithography tool by semiconductor wafer technology and level;
   storing said tilt adjustment values in a database;
   identifying a technology and level of a semiconductor wafer to be printed;
   retrieving the corresponding tilt adjustment value from said database;
   adjusting said lithography tool by said corresponding tilt adjustment value.

6. The method of claim 5, wherein said tilt adjustment values are based upon an image type occurring in said technology and level.

7. The method of claim 5, wherein said tilt values relate to an angle of an optics wavefront projected by said lithography tool relative to the wafer in a direction substantially perpendicular to a scanning direction.

8. The method of claim 5, said characterizing step including:
   plotting an image size deviation for a range of offsets of said projection optics from said wafer versus coordinates along said scanning direction; and
   selecting offsets corresponding to a minimum deviation.

9. The method of claim 8, further comprising determining said tilt values based upon a pattern established, with respect to said coordinates, by said offsets corresponding to a minimum deviation.

10. The method of claim 9, wherein said tilt values correspond to a linearization of said pattern.

11. The method of claim 5, wherein said tilt adjustment values are characterized relative to a resist image profile.

12. The method of claim 5, wherein said tilt adjustment values are characterized relative to a common process window.

13. The method of claim 5, wherein said tilt adjustment values are characterized relative to a common process latitude.

14. The method of claim 5, wherein said tilt adjustment values are characterized relative to an across-field linewidth variation.

15. A system comprising:
   a database storing tilt values for adjusting a lithography tool per semiconductor wafer technology and level;
   a logistics system which identifies a wafer technology and level to be printed by a lithography tool, said logistics system transferring said identified technology and level as parameters to retrieval means;
   retrieval means for receiving said parameters and retrieving tilt values corresponding thereto from said database;
   a lithography tool which receives said tilt values from said retrieval means and performs a corresponding adjustment.

16. The system of claim 15, wherein said adjustment is performed on a per-lot basis of semiconductor lots being printed.

17. The system of claim 15, further including monitoring means for detecting and correcting a drift in said lithography tool.

18. The system of claim 17, wherein said monitoring means shuts down said lithography tool when said drift exceeds a pre-determined limit.

* * * * *